United States Patent
Iben

(10) Patent No.: US 9,678,145 B2
(45) Date of Patent: Jun. 13, 2017

(54) SYSTEMS AND METHODS TO TEST AND/OR RECOVER MAGNETIC SENSORS WITH ESD OR OTHER DAMAGE

(71) Applicant: International Business Machines Corporation, Armonk, NY (US)

(72) Inventor: Icko E. T. Iben, Santa Clara, CA (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/150,266

(22) Filed: May 9, 2016

(65) Prior Publication Data
US 2016/0252569 A1  Sep. 1, 2016

Related U.S. Application Data

(62) Division of application No. 14/181,487, filed on Feb. 14, 2014, now Pat. No. 9,377,518, which is a division of application No. 12/782,190, filed on May 18, 2010, now Pat. No. 8,704,511.

(51) Int. Cl.
| | |
|---|---|
| G01R 31/28 | (2006.01) |
| G01R 33/09 | (2006.01) |
| G01R 35/00 | (2006.01) |
| B82Y 25/00 | (2011.01) |

(52) U.S. Cl.
CPC ......... *G01R 31/2829* (2013.01); *B82Y 25/00* (2013.01); *G01R 33/093* (2013.01); *G01R 35/00* (2013.01)

(58) Field of Classification Search
CPC ... G01R 31/2829; G01R 33/093; G01R 35/00
USPC ......................................................... 324/234
See application file for complete search history.

(56) References Cited

U.S. PATENT DOCUMENTS

| | | |
|---|---|---|
| 6,205,012 B1 | 3/2001 | Lear |
| 6,211,670 B1 | 4/2001 | DeWilde et al. |
| 6,366,420 B1 | 4/2002 | Ranmuthu et al. |
| 6,490,115 B1 | 12/2002 | Suzuki et al. |
| 6,574,078 B1 | 6/2003 | Voldman |
| 6,593,736 B1 | 7/2003 | Jang et al. |
| 6,710,594 B2 | 3/2004 | Eunkyu et al. |
| 6,828,784 B2 | 12/2004 | Yun et al. |
| 6,975,474 B2 | 12/2005 | Naka |
| 7,525,771 B2 | 4/2009 | Iwase |

(Continued)

OTHER PUBLICATIONS

Lai et al., Effect of Electrostatic Discharge on Tunneling Magnetoresistive Sensor, EOS/ESD Symposium 06-116, 1-58537-115-7 © 2006 ESDA, p. 2B.6-1 to 2B.6-4.*

(Continued)

*Primary Examiner* — Thomas Valone
(74) *Attorney, Agent, or Firm* — Zilka-Kotab, P.C.

(57) ABSTRACT

A system for testing a magnetic sensor according to one embodiment includes a discharge circuit to cause a discharge event on a magnetic sensor; a bias generation circuit to apply at least one first bias current to the sensor and at least one second bias current to the sensor, the second bias current being different than the first bias current; a resistance determination circuit to determine a resistance of the magnetic sensor at each of the applied bias currents; and a damage determination circuit to determine whether the magnetic sensor is damaged and/or was fixed by a discharge event based on the resistances.

10 Claims, 9 Drawing Sheets

(56) References Cited

U.S. PATENT DOCUMENTS

| | | | |
|---|---|---|---|
| 7,548,405 | B2 | 6/2009 | Czarnecki et al. |
| 7,742,252 | B2 | 6/2010 | Biskeborn et al. |
| 8,018,226 | B2 | 9/2011 | Iben et al. |
| 8,704,511 | B2 | 4/2014 | Iben |
| 9,377,518 | B2 | 6/2016 | Iben |
| 2002/0118475 | A1 | 8/2002 | Ng et al. |
| 2008/0116886 | A1 | 5/2008 | Yamada et al. |
| 2009/0268324 | A1 | 10/2009 | Iben |
| 2011/0285394 | A1 | 11/2011 | Iben |
| 2014/0159750 | A1 | 6/2014 | Iben |

OTHER PUBLICATIONS

Restriction Requirement from U.S. Appl. No. 12/782,190, dated Sep. 6, 2012.
Non-Final Office Action from U.S. Appl. No. 12/782,190, dated Jan. 14, 2013.
Final Office Action from U.S. Appl. No. 12/782,190, dated Aug. 8, 2013.
Advisory Action from U.S. Appl. No. 12/782,190, dated Nov. 21, 2013.
Notice of Allowance from U.S. Appl. No. 12/782,190, dated Dec. 10, 2013.
Iben, I.E.T., U.S. Appl. No. 14/181,487, filed Feb. 14, 2014.
Restriction Requirement from U.S. Appl. No. 14/181,487, dated Jun. 2, 2015.
Wikipedia, "Ground loop (electricity) and ferrite choke coils," Wikipedia, p. 1-4.
AE6TY, "Constructing and Using chokes and traps," retrieved from www.ae6ty.com/Papers_files/Using%20Chokes%20and%20Traps.pdf, Aug. 31, 2012, p. 1-29.
Waller et al., "Ground Loops—Truth or Consequences," Smart Power Quarterly, Apr. 2000, p. 1-2.
Iben, I.E.T., U.S. Appl. No. 12/782,190, filed May 18, 2010.
Non-Final Office Action from U.S. Appl. No. 14/181,487, dated Oct. 19, 2015.
Wallash, A., "Electrostatic Modeling and ESD Damage of Magnetoresistive Sensors," IEEE Transactions on Magnetics, vol. 32, No. 1, Jan. 1996, p. 49-53.
Wallash et al., "A New Electrical Overstress (EOS) TEst for Magnetic Recording Heads," EOS/ESD Symposium, 2006, pp. 131-135.
Notice of Allowance from U.S. Appl. No. 14/181,487, dated Mar. 30, 2016.

\* cited by examiner

SYSTEMS AND METHODS TO TEST AND/OR RECOVER MAGNETIC SENSORS WITH ESD OR OTHER DAMAGE

BACKGROUND

The present invention relates to data storage testing and recovery systems, and more particularly, this invention relates to systems and methods to test and/or recover sensors with Electrostatic Discharge (ESD) and other magnetic damage.

ESD damage to Giant Magnetoresistive (GMR) sensors is a major source of yield loss for magnetic GMR read sensors used in tape and hard disk storage drives as well as other applications. The damage mechanism which has one of the lowest current/voltage thresholds for damage is the pinned layer reversal. A pinned layer may be present in a magnetic sensor to act as a reference to the free layer and/or to stabilize other layers. Pinned layer reversal may occur at current/voltage levels about half those required for permanent damage. When diodes are connected in parallel with the GMR sensor, the sensors are damaged in the same manner as without diodes, except the damage thresholds are increased by factors of 5 to 10 or more.

The standard method of recovering a GMR sensor with a pinned layer reversal is to apply a bias current to the sensor of in the appropriate bias direction to favor normal pinned layer orientations and with a high enough magnitude and of an appropriate pulse width (time duration) to cause the reversal to the proper orientation while not causing damage to the sensor.

Pulse generators have been used to achieve the appropriate results. The problem with prior approaches have been the need for expensive pulse generators. Another problem with programmable pulse generators is that short time duration pulse generators have limited current levels, usually 10 to 100 mA for a 10 ns pulse width, and even less for shorter pulse durations. When diodes protection is applied to the sensors, the currents required to cause a pinned layer reversal for a pulse width of <10 ns can be of the order of 1 A or more. Standard, inexpensive, programmable pulse generators are not designed for generating currents high enough to recover the pinned layer reversal using short time pulses, and require expensive special equipment. One approach used write drivers in a hard disk drive (HDD) to pulse the head for recovery of heads without diode protection. Since write drivers typically are supplied by about 5 to 10 V maximum, recovering a diode protected sensor will probably not be possible, since the voltages required can be 50 V or more. Furthermore, in the case of tape drives, where the number of sensors is 36 or more in extant drives, cost of the circuitry to switch the sensors between the pulse and the normal operation is significant, since each drive would require the relay switches for each sensor.

Another issue with recovery is the desire to know whether the sensor is recovered. To measure the recovery, one typically measures the sensor response to an applied external magnetic field, such as an electromagnet or by reading data written on magnetic media. These methods are impractical and expensive. Reading data from magnetic media requires mounting the head onto a magnetic tester to read the media, which is time consuming. Applying an external magnetic field on the sensor will not work with head which has a magnetically actuated head. For example, tape heads contain magnetic actuators which could be damaged by magnetic torques if placed in a strong homogeneous magnetic field.

BRIEF SUMMARY

A system for testing a magnetic sensor according to one embodiment includes a discharge circuit to cause a discharge event on a magnetic sensor; a bias generation circuit to apply at least one first bias current to the sensor and at least one second bias current to the sensor, the second bias current being different than the first bias current; a resistance determination circuit to determine a resistance of the magnetic sensor at each of the applied bias currents; and a damage determination circuit to determine whether the magnetic sensor is damaged and/or was fixed by a discharge event based on the resistances.

A computer program product for determining whether a magnetic sensor is damaged, according to one embodiment, includes a computer readable storage medium having program instructions embodied therewith, the program instructions executable by a processing circuit to cause the processing circuit to: measure resistances of a magnetic sensor at multiple bias currents; determine that the magnetic sensor is damaged based on the measured resistances; select a bias voltage sufficient to cause a discharge event that repairs the damaged magnetic sensor to a proper magnetic state thereof; apply the bias voltage to the magnetic sensor; and couple the lead of the magnetic sensor to ground after applying the bias voltage for causing the discharge event. The discharge event fixes the damaged magnetic sensor.

Any of these embodiments may be implemented in or in conjunction with a system such as a tape drive system, which may include a magnetic head, a drive mechanism for passing a magnetic medium (e.g., recording tape) over the magnetic head, and a controller electrically coupled to the magnetic head.

Other aspects and embodiments of the present invention will become apparent from the following detailed description, which, when taken in conjunction with the drawings, illustrate by way of example the principles of the invention.

DETAILED DESCRIPTION

Figure 1:
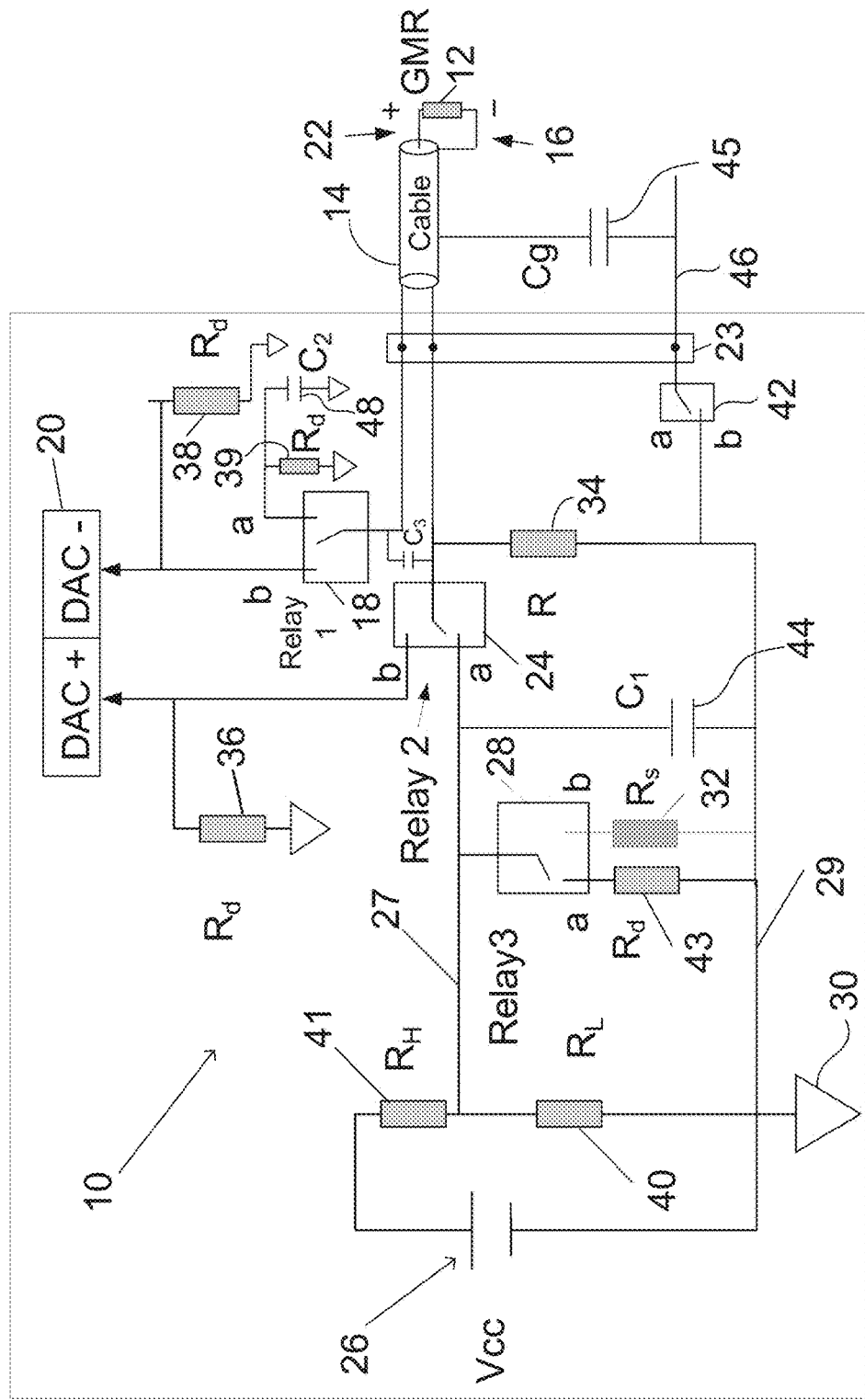
FIG. 1 is a schematic diagram of a pinned layer recovery system according to one embodiment.

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation, including meanings implied from the specification as well as meanings understood by those skilled in the art and/or as defined in dictionaries, treatises, etc.

It must also be noted that, as used in the specification and the appended claims, the singular forms "a," "an" and "the" include plural referents unless otherwise specified.

The following description discloses several preferred embodiments of systems, as well as operation and/or component parts thereof. Embodiments of the present invention use a discharge event, referred to illustratively as a cable discharge event (CDE) (noting that an actual cable may or may not be involved), to apply a current pulse to a magnetic sensor to cause the recovery of pinned layer magnetic orientation from a reversed state and/or removal of multiple domains or to anneal the sensor. The CDE in one approach involves charging the sensor with a power supply and subsequently discharging the sensor through a resistor by closing a relay (e.g., switch, transistor, etc.). The system may preferably be calibrated for current versus voltage and measurements may preferably be made to determine the charge voltage used to recover the sensor's pinned layer orientation and/or remove the multiple magnetic domains or to anneal the sensor. Simple, inexpensive power supplies, which may be employed in some embodiments, can, if desired, easily supply currents of an Ampere or more by choosing the appropriate charging voltage and relying on the capacitive charge stored in the cable or added capacitor. Such power supplies can also be controlled to a high precision, for example supplying voltages accurate to 1% or better.

To determine whether the sensor is recovered, the tester can measure the resistance ($R_p = R(I_{bias})$) of the sensor with a current of $+I_{bias}$ and ($R_n = R(-I_{bias})$) at a current of $-I_{bias}$. An appropriate choice of values for $I_{bias}$ would be currents whose magnitude is in the operating range of the sensor. $I_{bias}$ applies an internal magnetic field to the free layer (FL) of the sensor, causing the resistance to change due to the GMR affect. A current of $-I_{bias}$ will rotate the magnetic field in the sensor FL in the opposite direction as with the $I_{bias}$. Since the current also heats the sensor via Joule heating, which can cause significant resistance changes, measuring the resistance at both $+I_{bias}$ and $-I_{bias}$ and taking the difference will allow one to discern the GMR effect over and above the Joule heating.

Detection of damage to and/or recovery of a GMR sensor may be made using a variety of methods, as disclosed herein. In one approach, the detection of damage and/or recovery uses the parameters $R_{pn}(I_{bias})$, and/or $R_{pnI}(I_{bias})$, and/or $R_{pnscaled}(I_{bias})$, and/or $R_{pnIscaled}(I_{bias})$, which are given by Equations 1a, 1b, 1c and 1d:

$$R_{pn}(I_{bias}) = [R(+I_{bias}) - R(-I_{bias})], \quad \text{1a.}$$

$$R_{pnI}(I_{bias}) = R_{pn}(I_{bias})/I_{bias}, \quad \text{1b.}$$

$$\text{and } R_{pnscaled}(I_{bias}) = 200\% * R_{pn}(I_{bias})/[R(+I_{bias}) + R(-I_{bias})]]. \quad \text{1c.}$$

$$\text{and } R_{pnIscaled}(I_{bias}) = 200\% * R_{pn}(I_{bias})/[R(+I_{bias}) + R(-I_{bias})]]. \quad \text{1d.}$$

Though Equations 1a-d represent several useful forms of analyzing the difference $R_p - R_n$, they are not the only forms, and one could determine other choices which utilize the same or similar concepts. Such other choices should be considered in the same class of equations. One important concept may be to take an average $<f>$ of one of the parameters ($f(I_{bias})$) over a range of currents:

$$<f> = \Sigma f(I_{bias})_{\{Ibias\}} \quad \text{2.}$$

Since $R_{pn}(I_{bias})$ should be linear in $I_{bias}$, $<R_{pn}>$ and $<R_{pnI}>$ are good choices of functions to utilize Equation 2.

In one general embodiment, a system includes a power supply for charging a lead of a magnetic sensor to a voltage; an interface for operatively coupling the power supply to the lead of the magnetic sensor; a relay for selectively coupling the lead of the magnetic sensor to ground for causing a discharge event, wherein the discharge event reverses a magnetic orientation of a pinned layer of the magnetic sensor; and a shorting resistor between the relay and ground.

In one general embodiment, a system for testing a magnetic sensor includes a discharge circuit to cause a discharge event on a magnetic sensor; a bias generation circuit to apply at least one first bias current to the sensor and at least one second bias current to the sensor, the second bias current being different than the first bias current; a resistance determination circuit to determine a resistance of the magnetic sensor at each of the applied bias currents; and a damage determination circuit to determine whether the magnetic sensor is damaged and/or was fixed by a discharge event based on the resistances.

In another general embodiment, a method includes measuring resistances of a magnetic sensor at multiple bias currents; determining that the magnetic sensor is damaged based on the measured resistances; selecting a bias voltage sufficient to cause a discharge event that repairs the damaged magnetic sensor to a proper magnetic state thereof; and applying the bias voltage to the magnetic sensor; and coupling the lead of the magnetic sensor to ground after applying the bias voltage for causing the discharge event, wherein the discharge event fixes the damaged magnetic sensor.

Description of CDE

FIG. 1 is a schematic diagram of a pinned layer recovery system 10 according to one embodiment. As will become apparent when reading the description of the FIG., such system may include one or more of the circuits listed herein, such as a discharge circuit to cause a discharge event on a magnetic sensor; a bias generation circuit to apply at least one first bias current to the sensor and at least one second bias current to the sensor, the second bias current being different than the first bias current; a resistance determination circuit to determine a resistance of the magnetic sensor at each of the applied bias currents; and/or a damage determination circuit to determine whether the magnetic sensor is damaged and/or was fixed by a discharge event based on the resistances. Moreover, one or more of these circuits may be part of a different system, e.g., computer, processor, etc., in communication with the system 10 of FIG. 1.

As shown in FIG. 1, a GMR sensor 12 is mounted on a cable 14, where the cable 14 may or may not be present, and may or may not be part of the system 10. The negative lead 16 of the sensor connects to Relay 1 18. The b side of Relay 1 18 connects to the negative side of the data acquisition module DAC 20 (DAC−), which is discussed in more detail below. The positive lead 22 of the sensor 12 is coupled to Relay 2 24. The coupling of the positive lead 22 to Relay 2 24 and the negative lead 16 to Relay 1 18 within system 10 is done via an appropriate interface 23, which may include a cable; pads, pins or a socket for coupling directly to the sensor; pads, pins or a socket for coupling to a cable that is coupled to the sensor; etc. The "a" side of Relay 2 24 is connected to the CDE power supply 26 and the "b" side connects to the positive side of the DAC 20 (DAC+). The CDE power supply 26 charges up to a voltage $V_{CC}$, which may be applied to a voltage divider of two high impedance resistors, $R_L$ 40 and $R_H$ 41. Reasonable values of $R_L$ and $R_H$ are and 1 MΩ and 100 kΩ respectively, but could be higher or lower. Usually, one would choose $R_H \ll R_L$ so that the charge on the cable ($V_{cable}$) approaches $V_{cc}$. $R_H$ and $R_L$ are also both chosen to be $\gg R_S$, so $V_{cable}$ approaches zero when the CDE event is over. $R_H$ is also chosen large enough so that charging is slow enough to avoid damaging the sensor when $V_{cc}$ is turned on. This avoids complex charging algorithms. $R_s$ may have a resistance of less than about 500 ohms, but preferably about 10 ohms or lower.

In the discussion that follows, it is assumed that current flow from the negative lead 16 of the GMR sensor 12 to the positive lead 22 of the GMR sensor 12 results in a reversal of the pinned layer magnetization to the undesired orientation, while current flow from the positive lead 22 to the negative lead 16 of the GMR sensor 12 leads to proper orientation of the pinned layer magnetization. In other approaches, the opposite may be true.

Figure 2:
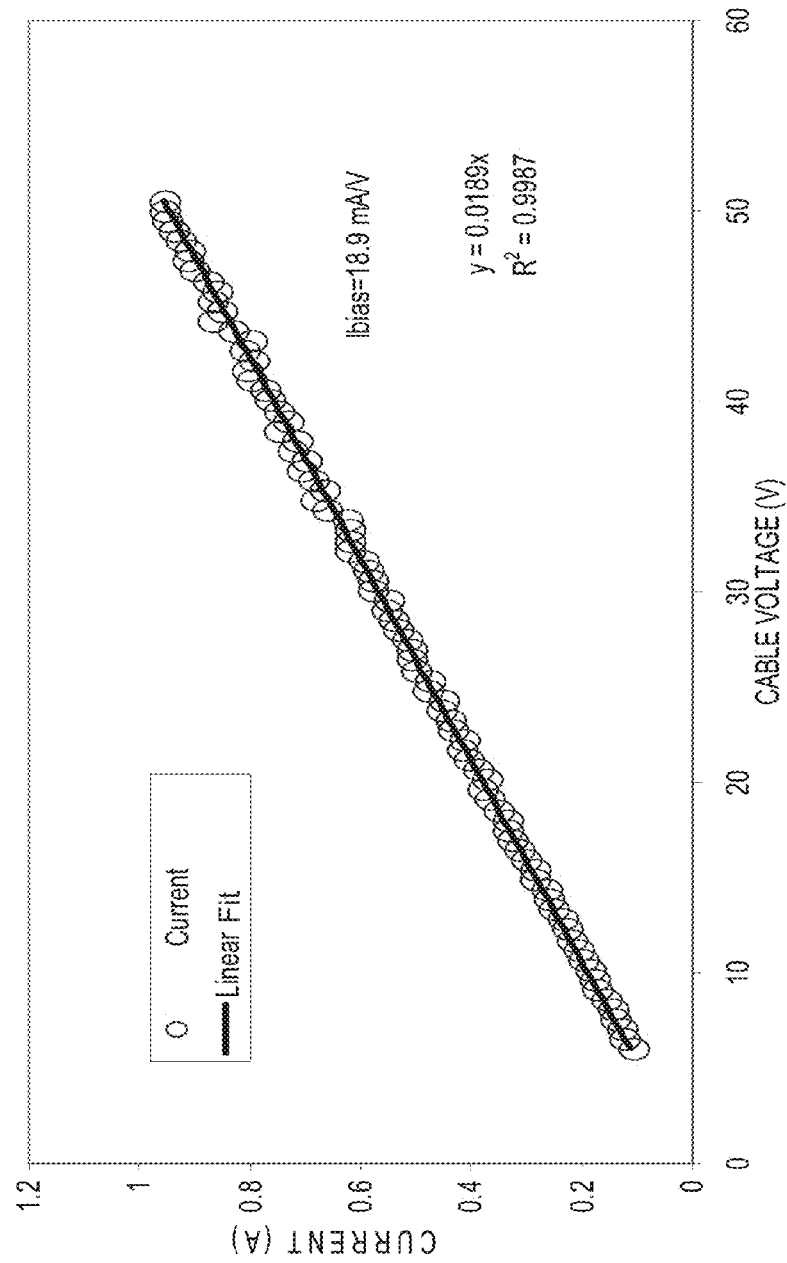
FIG. 2 depicts current through $R_s$ versus cable voltage, $V_{cc}$ according to one embodiment.

The following process may be used to recover a magnetically damaged sensor, where it is assumed that current flow from the negative lead 16 of the GMR sensor 12 to the positive lead 22 of the GMR sensor 12 results in a reversal of the pinned layer magnetization to the undesired orientation, while current flow from the positive lead 22 to the negative lead 16 of the GMR sensor 12 leads to proper orientation of the pinned layer magnetization. Referring to FIG. 1, Relay 1 18 and Relay 2 24 are set to the "a" position, and Relay 3 28 is set to open, a-side. The positive lead 22 of the GMR sensor 12 is charged to a negative voltage by $V_{cc}$. The positive lead 22 of the GMR sensor 12 is then rapidly connected to system ground 30 through shorting resistor $R_s$ 32 by switching Relay 3 28 to the b side. Upon the discharge, positive current flows from the positive lead 22 through the negative lead 16 of the GMR sensor 12, termed forward bias current flow. If the current is high enough, the head will recover. The current passing through the shorting resistor, $R_s$, 32 is linear with respect to the cable voltage, $V_{cc}$, as is seen in FIG. 2. Particularly, FIG. 2 depicts current through $R_s$ versus cable voltage, $V_{cc}$.

It is desirable to while switching relays, current pulses. To increase the probability of avoiding unwanted current pulses are avoided, all leads may be connected to signal ground through high resistance resistors, $R_d$ 34, 36, 38, 39 and 43 which may have the same values or different values. An illustrative resistance value for $R_d$ of about 1-10 MΩ is also a good choice given the values of $R_H$ and $R_L$ given above. Lower values for Rd, such as down to about 50 kΩ could be used, but this depends on the complex circuit and the choice for $R_H$, $R_L$ and $R_S$. Since during the charging process, $R_d$ 34, $R_d$ 39 and $R_d$ 43 are in parallel, with $R_L$ 40, $R_d$ 34, 39 and $R_d$ 43 are preferably chosen to be comparable or larger than $R_L$ 41 to ensure that the cable is charged sufficiently, i.e. $V_{cable}$ approaches $V_{cc}$. Note that the cable is charged to a voltage Vcable of:

$$V_{cable} = V_{cc} * R_{L2}/[R_{L2} + R_H],\qquad\text{3a.}$$

where $$1/R_{L2} = 1/R_L 40 + 1/R_d 34 + 1/R_d 39 + 1/R_d 43. \qquad\text{3b.}$$

It is believed that shorter pulse widths are better in terms of reducing the chance of causing permanent damage to the sensor. Accordingly, the pulse width of the discharge event preferably has a duration of less than about 45 nanoseconds (ns) and greater than 0 ns, where "about X" means X±10%. In some approaches, the pulse width of the discharge event is less than about 10 ns, and in further approaches is less than about 5 ns, and in yet other approaches less than about 1 ns.

In other approaches, however, it may be desirable to increase the pulse width. This may allow use of lower voltages to reverse the pinned layer. In one approach, a ground plane of the cable 14 may be coupled to ground via a relay 42. Note that the cable ground is coupled to the cable leads by a capacitance $C_g$ 45.

In some approaches, it may be desirable to include one or more capacitors such as $C_1$, $C_2$, and/or $C_3$ to assist in obtaining the desired pulse shape. Such capacitors may have a capacitance in the 1 s or 10 s of picofarads or more, and may each have a different capacitance. For example, one embodiment includes a capacitor $C_1$ 44 in the path between the magnetic sensor and ground. This has the effect of increasing the charge in the pulse caused by the discharge event and reduces the voltage needed to reset the pinned layer. The capacitor also broadens the pulse width, so it offers an inexpensive means of adjusting the pulse width. Moreover, capacitor $C_2$ 48, coupled between another lead of the sensor 12 and ground, and in the embodiment shown in parallel with resistor 39, is preferably implemented when the cable ground plane 46 is not connected to the Vcc ground plane 30 (floating). Capacitor $C_3$ is particularly useful in embodiments having a floating cable ground plane. Capacitor $C_3$ may have a value in the few to tens of picofarads.

It is typical for high speed cards to use ground planes for noise reduction. In some embodiments, however, the system does not include a ground plane in the system board. Systems not having a ground plane have been found to avoid damage to sensitive elements when the relays are switched (toggled). Removal/omission of the ground plane avoids introduction of an electronic coupling between the sensors and relays when switching that, in experiments, using more sensitive GMR elements, surprisingly and unexpectedly damage the more sensitive elements 12.

In addition, an inductive choke of any type, such as a ferrite core, may be coupled to one or more of the leads 27, 29 from the power supply, thereby creating a high impedance path for unwanted currents such as ground loop currents. Preferably, the inductive choke provides an inductance of greater than about 1000 microhenry, but optimally greater than 0.5 millihenry. In one approach, the lead(s) may be wrapped around a ferrite core. Use of an inductive choke is particularly preferred in embodiments having no ground plane, as the ground loops tend to dominate such systems. These in turn give broad LRC oscillations. In our experiments, with no inductive choke, the LRC oscillations had periods of the order of 100 to 250 ns, yielding pulses of the order of 50 ns or more, which results in a very narrow set voltage (current) window available to fix heads.

The sensor and/or cable may include crossed diodes that operatively couple the two leads of the magnetic sensor by providing a low resistance shunting path for the bulk of an ESD or CDE current to bypass the GMR sensor. Though the bulk of the ESD current will pass through the diodes in a high current ESD or CD event, a fraction of the current will pass through the sensor. The values of $V_{cable}$ required to repair a cabled GMR sensor with diode protection may increase 50 to 100 times over that required to repair a non-diode protected GMR sensor, requiring voltage values of 10 s to 100 s of Volts, which is easily achieved using inexpensive power supplies. The system described herein works even with the presence of such diodes, as the voltage is applied to one leg of the sensor. An illustrative scheme includes crossed diodes coupling the leads of the sensor together. The crossed diodes may be formed on the chip comprising the sensor, may be formed on or coupled to a cable coupled to the sensor leads, etc. U.S. Pat. No. 7,548,405, which is herein incorporated by reference, discloses illustrative ESD protection schemes employing diodes that may be used in conjunction with the sensors disclosed herein.

The DAC 20, if present, is a mechanism that is used to measure the resistance of the sensor 12 at various bias currents. The DAC 20 may provide the bias currents to the sensor in one or both polarities (dual polarity). A resistance $R_p$ is observed when current flows from the positive sensor lead (connected to DAC+) to the negative sensor lead (connected to DAC−), and $R_n$ is observed when current flows in the reverse direction (reverse polarity).

In one approach, the multiple bias currents include at least one current at a positive polarity and at least one current at a negative polarity. In another approach, the multiple bias currents include several currents at a positive polarity or several currents at a negative polarity. The DAC 20 in one approach is a dual polarity DAC that applies the currents to the magnetic sensor.

A method for determining whether a sensor is damaged and/or whether the sensor has been repaired by a CDE according to one embodiment includes measuring resistances of a magnetic sensor at multiple bias currents, e.g., using a DAC capable of supplying currents of both positive and negative polarity. Again, the bias currents may be all of one polarity, but preferably include currents at both polarities. A determination is made, e.g., by the DAC, that the magnetic sensor is damaged based on the measured resistances. A bias voltage sufficient to cause a discharge event that fixes the damaged magnetic sensor is selected and applied to the magnetic sensor. Illustrative methods for selecting the proper bias voltage will be evident from the following description. The lead of the magnetic sensor to which the voltage was applied is selectively coupled to ground for causing the discharge event, where the discharge event fixes the damaged magnetic sensor.

Detection of Magnetic Damage and Recovery Using Pos-Neg Test: $R_{pn}$ or $R_{pnscaled}$ or $R_{pnI}$ or $R_{pnIscaled}$.

As noted above, magnetic sensors may suffer from a variety of magnetic damage mechanisms, including pinned layer reversal, multiple magnetic domains within the antiferromagnetic (AFM) or the PL or FL of the sensor, or degradation of the sensor due to permanent physical damage such as metal layer interdiffusion or electromigration or melting.

The GMR magnetic response of a sensor has been traditionally measured using an external magnetic field and measuring the change in resistance of the sensor versus external field. The quasi amplitude (Amp) is defined as the change in voltage of the GMR sensor at $+H_{field}$ and $-H_{field}$ using a constant current ($I_{bias}$) source as in Equation 3:

$$\text{Amp}=V(+H_{field})-V(-H_{field})=I_{bias}*[R(+H_{field})-R(-H_{field})] \quad \quad 4.$$

Figure 3:
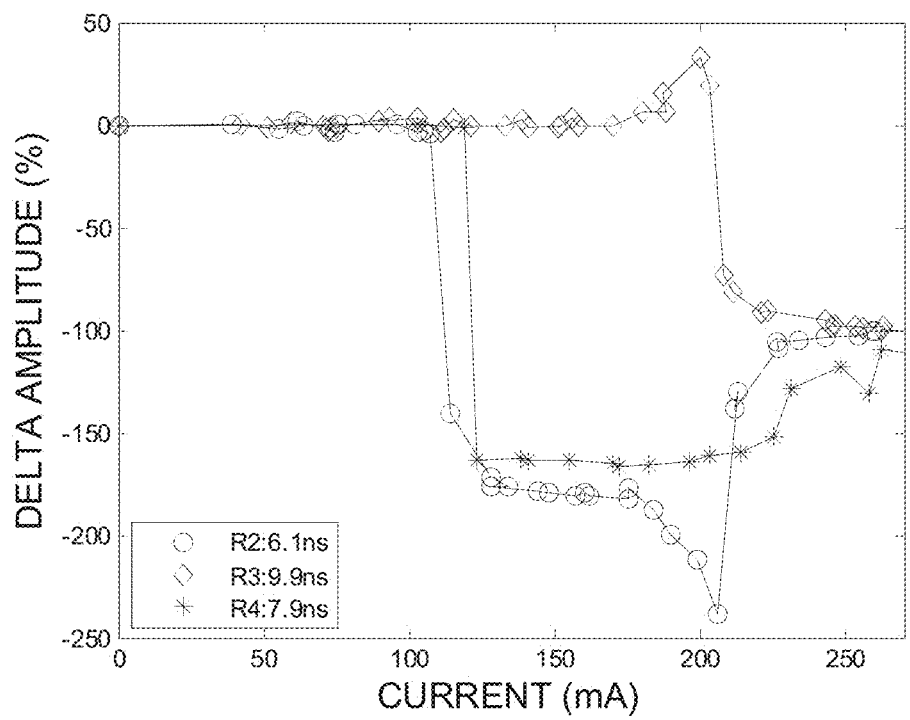
FIG. 3 is a plot of the change in quasi magnetic amplitude versus bias current.

FIG. 3 plots the change in quasi magnetic amplitude versus CDE current. The current pulse is achieved by charging the cable to a given voltage, $V_{cable}$, by applying a voltage $V_{cc}$, and then discharging the charged cable through $R_s$. As shown in FIG. 2, $I_{pulse}$ is linearly proportional to $V_{cable}$ ($V_{cc}$). Vcc ($V_{cable}$) is positive for sensors R2 and R4 and negative for sensor R3. Thus, the current pulse through the sensor is reverse biased for R2 and R4 and forward biased for R3. A pinned layer reversal occurs for R2 and R4 but not for R3. The change in amplitude, compared to the initial amplitude (ΔAmp), is measured after each current pulse ($I_{pulse}$) and plotted versus $I_{pulse}$. A negative change of greater than −100% indicates a pinned layer reversal. For the parts studied, the reversal occurred at currents of about 120 mA (6.3 V) for reverse bias pulses (R2 and R4). The sensor R3, which was subjected to forward bias pulses, did not undergo pinned layer reversal. At about 175 mA (9.3 V), the amplitude began to change, and the magnitude of the amplitude, |Amp| began to increase with current pulse. This is permanent damage associated with metal diffusion within the GMR stack. Total destruction occurred between about 200 and 225 mA (10.6 and 11.9 V). Note that once a pinned layer is reversed, forward bias currents act upon the new magnetic state in the same manner as reverse bias currents act upon a GMR with a normal GMR magnetic state. That is, a GMR with a reversed pinned layer will flip back to the normal magnetic state by applying a forward biased CDE current with a current pulse between about 120 and 175 mA (6.3 and 9.3 V). The result is a GMR with a normal pinned layer orientation, with stable magnetic layers.

Detection of the magnetic state of a GMR sensor can also be made using the Pos-Neg test, which uses the parameters $R_{pn}$ or $R_{pnI}$ or $R_{pnscaled}$ or $R_{pnIscaled}$ given earlier by Equations 1a, 1b, 1c and 1d. The change in $R_{pn}$ ($\Delta R_{pn}$) or $R_{pnI}$ ($\Delta_{pnI}$) or $R_{pnscaled}$ ($\Delta R_{pnscaled}$) or $R_{pnIscaled}$ ($\Delta R_{pnIscaled}$) from their initial values following a CDE pulse can be used to determine the state of the GMR sensor, e.g., whether it is still damaged or whether it has been repaired.

Figure 4A:
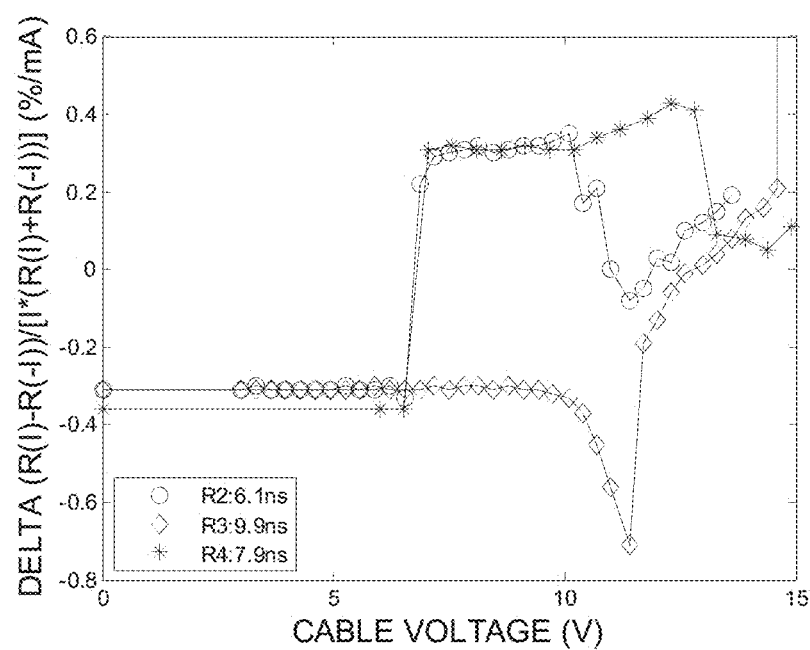
FIG. 4a is a plot of $R_{pn\text{-}scaled}$ versus cable voltage for a cabled sensor using a CDE technique according to one embodiment.
Figure 4B:
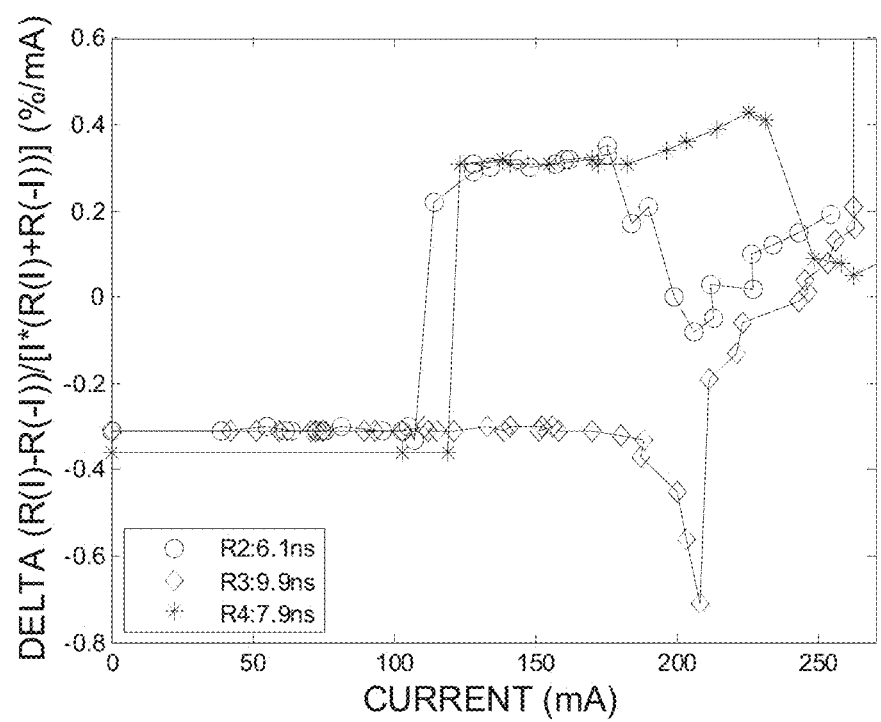
FIG. 4b is a plot of $R_{pn\text{-}scaled}$ versus bias current for a cabled sensor using the CDE technique according to one embodiment.

FIGS. 4a and 4b respectively plot $R_{pnIscaled}$ versus cable voltage and bias current using the same data points as shown in FIG. 3 with the quasi amplitude. Vcc is positive for R2 and R4 and negative for R3. A pinned layer reversal occurs for R2 and R4 but not for R3. Comparison of FIGS. 3, 4a and 4b clearly show that $R_{pnIscaled}$ can be reliably used to both verify that a sensor is damaged via a pinned layer reversal, and to verify that the sensor has recovered after the pulse.

Figure 5A:
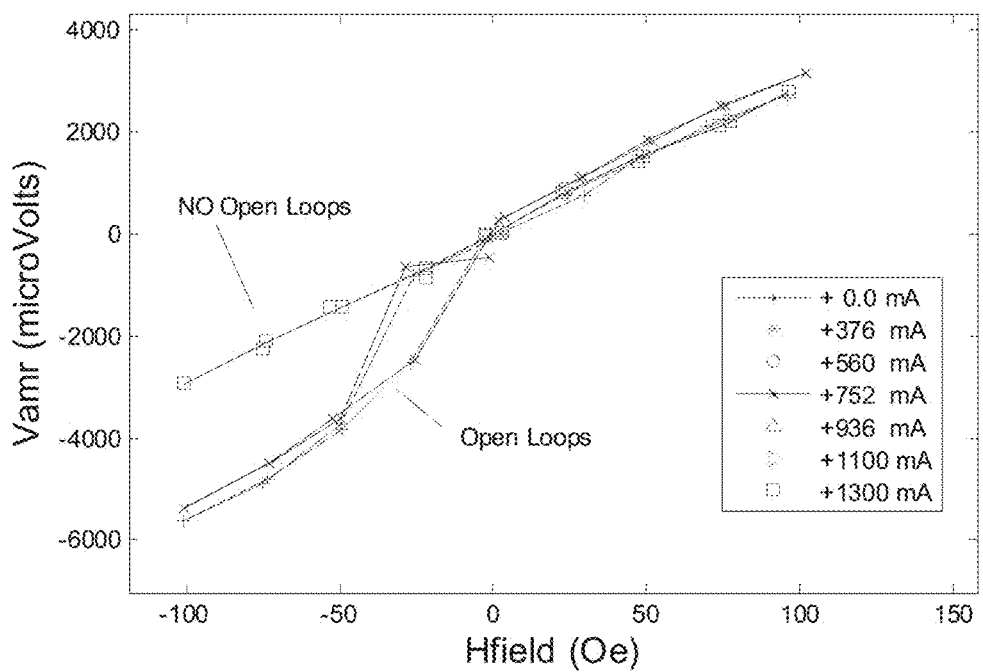
FIG. 5a is a plot of a Quasi Amplitude Transfer curve (hysteresis loop) for a sensor with diode protection.
Figure 5B:
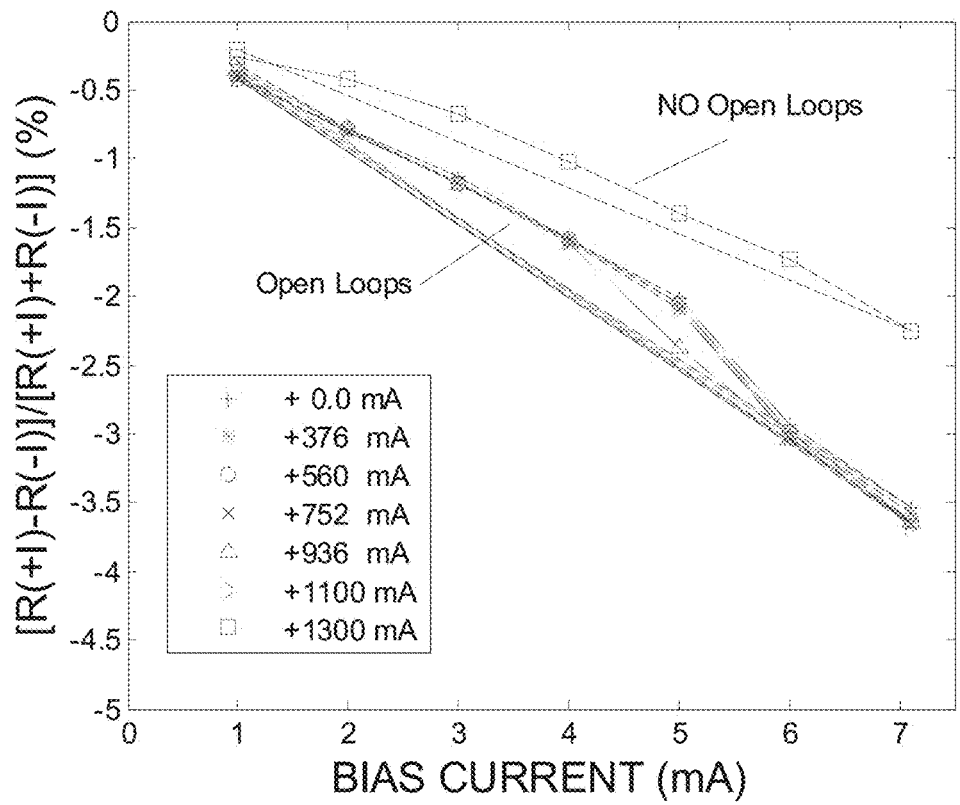
FIG. 5b is a plot of $\Delta R_{pn\text{-}scaled}$ for the sensor of FIG. 5a following CDE events of different current/voltage levels.

Besides pinned layer reversal, another form of magnetic damage is the presence of multiple domains within the sensor. Magnetic domains are observed as open loops or kinks in the sensor response curve (Amp($H_{field}$)) to an external magnetic field ($H_{field}$) also known as a transfer curve. FIG. 5 is a plot of Quasi Amplitude versus $H_{field}$ for Cycle0 through Cycle 6. The reader therein had diode protection. The reader was initially damaged having magnetic domains. The domains showed up both as an open loop and a kink in the hysteresis loop for Cycles 0 through 5 in FIG. 5. Both the open loop and the kink represent major deviations from linearity of Amplitude versus $H_{field}$. In Cycle6, the sensor is normal, as seen by the linear Amplitude versus $H_{field}$. The recovery of this sensor at Cycle6 will be discussed later.

Figure 6A:
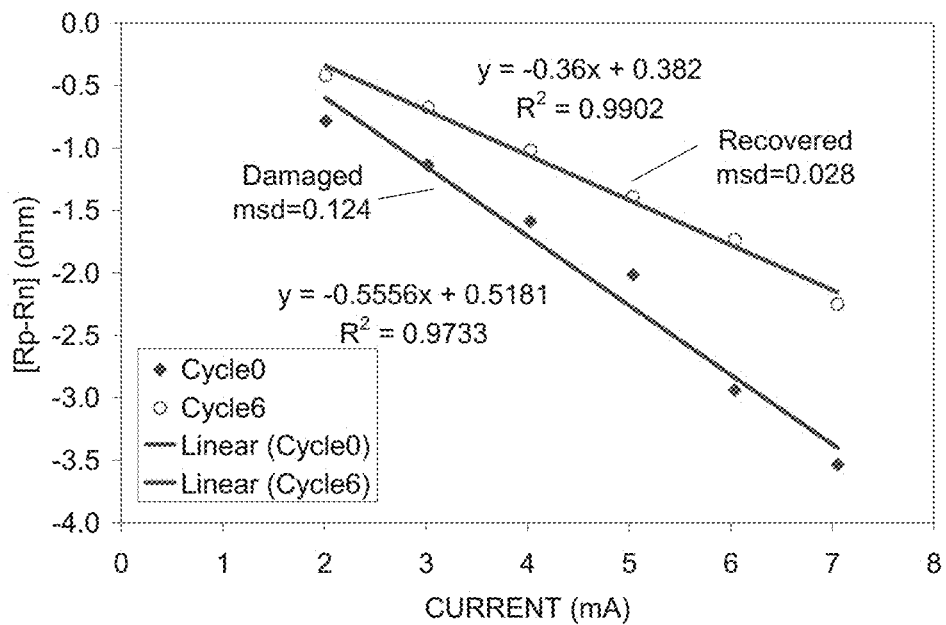
FIG. 6a is a plot of $R_{pn}$ versus current for Cycle0 and Cycle6.
Figure 6B:
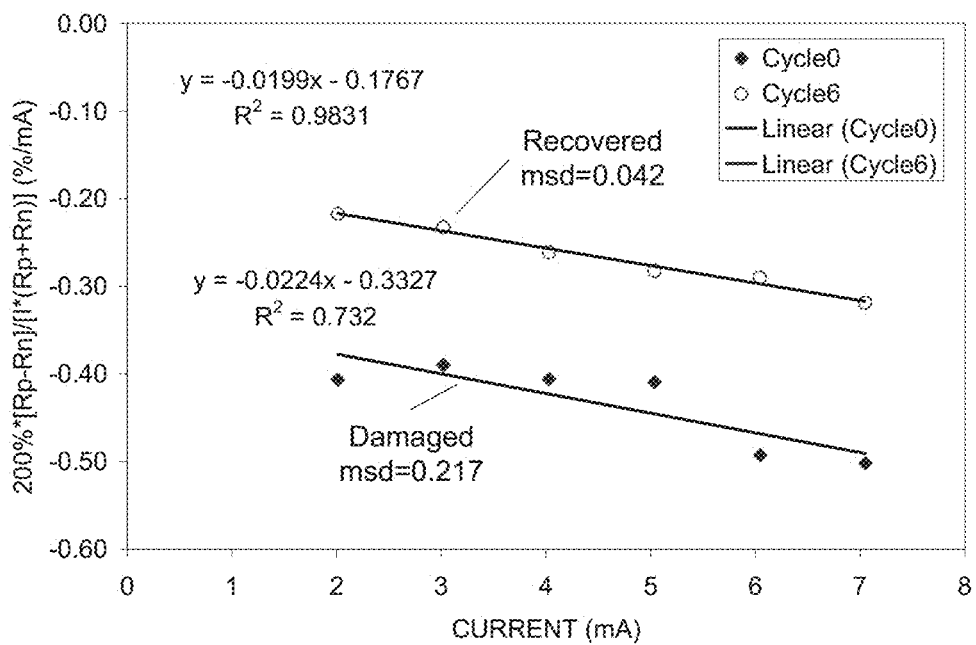
FIG. 6b is a plot of $R_{pnscaled}$ versus current for Cycle0 and Cycle6.

$R_{pnscaled}$ and $R_{pnIscaled}$ versus bias current can also be used to detect the presence of magnetic domains in sensor. FIG. 6a plots $R_{pnscaled}$ and FIG. 6b plots $R_{pnIscaled}$ versus $I_{bias}$ for Cycles 0 and 6 for the same head as shown in FIG. 5 for the Quasi Amplitude. The presence of domains in Cycle 0 shows up in the deviation of both $R_{pnscaled}$ and $R_{pnIscaled}$ from expected results of linear response versus bias current and an in the expected magnitude of $R_{pnscaled}$ or $R_{pnIscaled}$. To determine the magnetic state of the GMR sensor, the parts can be fit to a first order polynomial according to Equations 5a and 5b.

$$R_{pn\text{-}Fit}=R_{pno}+M_{pn}*I_{bias}, \text{ and} \qquad 5a.$$

$$R_{pnIscaled\text{-}Fit}=R_{pnISo}+M_{pnIS}*I_{bias}. \qquad 5b.$$

FIGS. 6a and 6b respectively are plots of $R_{pn}$ and $R_{pnIscaled}$ versus $I_{bias}$. The figures also show linear fits $R_{pn}$-Fit and $R_{pnIscaled\text{-}Fit}$. Table 1 summarizes the parameters used to make the fit. The slope $M_{pn}$ and the intercept $R_{pno}$ are 54% and 36% higher for Cycle0 than for Cycle6, yielding higher magnitudes for $R_{pn}$ for the former. The same is true for $R_{pnIscaled}$, where the slope $M_{pnS}$ and the intercept $R_{pnSo}$ are 13% and 88% higher for Cycle0 than for Cycle6, yielding higher magnitudes for $R_{pnIscaled}$ for the former. Finally, the mean square deviation (msd) for both $R_{pn}$ ($\sigma_{Rpn}$) and $R_{pnIscaled}$ ($\sigma_{RpnIS}$) from their linear fits are substantially higher for Cycle0 than for Cycle6: 4.4 times for $R_{pn}$ and 5.2 times for $R_{pnIscaled}$. All of these are a result of the presence of multiple domains in the Cycle0 state compared to the Cycle6 state.

TABLE 1

Parameters for fitting $R_{pn}$ and $R_{pnIscaled}$.

| | $R_{pn}$ | | | $R_{pnIscaled}$ | | |
|---|---|---|---|---|---|---|
| | $R_{pno}$ (%) | $M_{pn}$ (%/mA) | $\sigma_{Rpn}$ (%) | $R_{pnISo}$ (%/mA) | $M_{pnIS}$ (%/mA$^2$) | $\sigma_{RpnIS}$ (%/mA) |
| Cycle 0 | 0.518 | −0.556 | 0.124 | −0.333 | −0.0224 | 0.217 |
| Cycle 6 | 0.382 | −0.360 | 0.028 | −0.177 | −0.0199 | 0.042 |
| Ratio | 1.36 | 1.54 | 4.43 | 1.88 | 1.13 | 5.17 |

One can determine the expected values for $\sigma_{Rpn}$ and $\sigma_{RpnIS}$ using various techniques. For example, one could determine their values from a large population of good parts. Another means can be used in tape heads or other magnetic read devices which have multiple GMR devices within a single module device which were all processed from the same wafer in adjacent locations. In such a case, one could take the median of the values and choose the parts which are within pre-determined range of the median, such as:

$$N_s*\sigma_{product}, \qquad 5c.$$

where $\sigma_{product}$ is the mean-squared deviation of a large number of parts, and $N_s$ is a user defined number, such as 1 or 1.2 or 2, or 2.5 or 3, which determines how tight one wants to accept the variance of the parts. Any part which is within $N_s*\sigma_{product}$ of the median can be used to determine the expected value of $\sigma_{Rpn}$ or $\sigma_{Rpnscaled}$ for the sensor in question.

Detection of Magnetic Damage—Other Approaches

Various other methods may be used to detect damage to magnetic sensors and/or verify whether the sensor has been repaired by a CDE, any of which may be used by the various embodiments. Several methods are illustrated herein.

In one approach, the resistance values or values derived therefrom are compared to some comparative data, e.g., similar values derived from other sensors under similar conditions, data derived from manufacturing processes or verification, design parameters, etc. For example, $R_{pn}$ values for a plurality of read sensors may be measured, and any sensor having $R_{pn}$ values deviating from the average or median $R_{pn}$ values of the group by some predetermined amount can be marked as being damaged.

Figure 7:
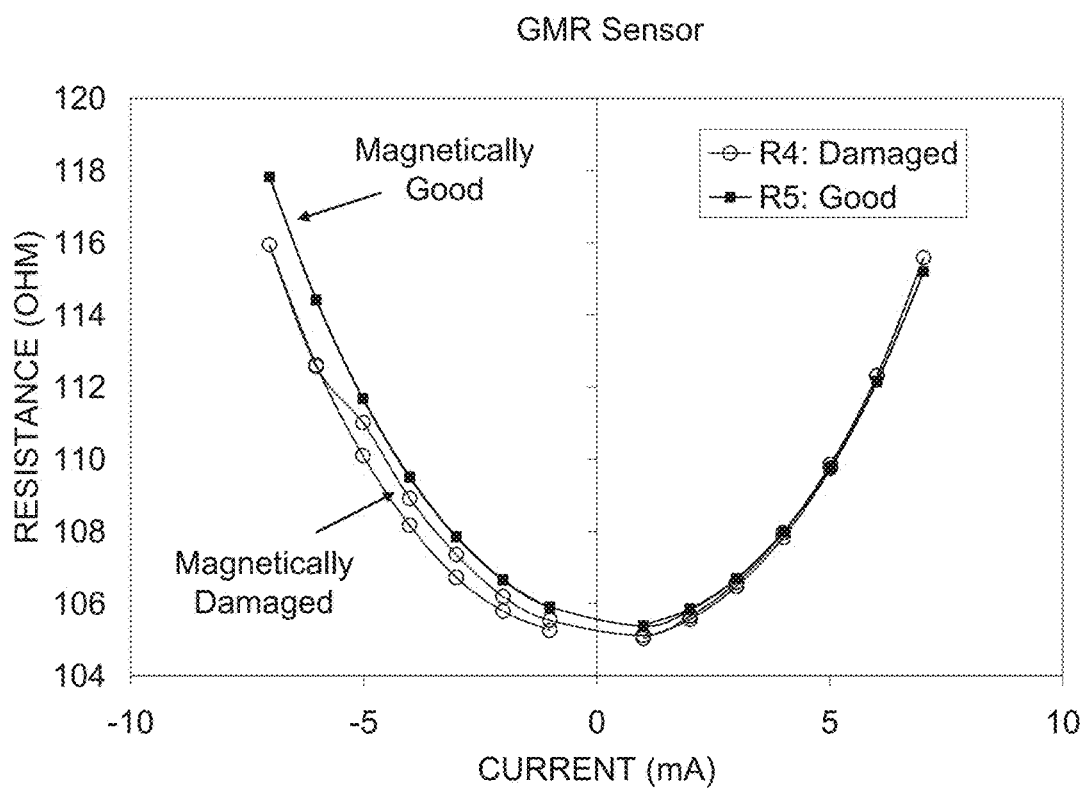
FIG. 7 is a plot of resistance versus bias current for a magnetically good (R5) and a magnetically damaged (R4) GMR sensor.

In another approach, a "looping" measurement of resistance is made, such as shown in FIG. 7. In FIG. 7, the resistance is measured versus bias current. The current is stepped from $I_{min}$ of 1 mA to $I_{max}$ of 7 mA in increments of +1 mA, and back down to 1 mA in decrements of −1 mA. The current is then stepped from $-I_{min}$ of −1 mA to $-I_{max}$ of −7 mA in decrements of −1 mA, and back up to 1 mA in increments of +1 mA. Two resistance values are measured each current (except for $\pm I_{max}$). An open loop is evident in the "Damaged" sensor curve (R4). For example, the two resistances at −5 mA are distinctly different. The measured points of the "Good" sensor (R5) are reproducible irrespective of the history of the current used to arrive at a given resistance.

To assist in describing and quantifying the curves, one can define $R_{up}(I_{bias})$ as the resistance measured at incrementally increasing current values between $I_{min}$ and $I_{max}$ (or $-I_{max}$ and $-I_{min}$) (inclusive) at increments of $\Delta I$ and $R_{down}(I_{bias})$ is measured from incrementally decreasing current values between $I_{max}$ and $I_{min}$ (inclusive) (or $-I_{min}$ and $-I_{max}$) at increments of $-\Delta I$ The following equations can be used to further understand the curves:

$$R_{loop\_p}=\Sigma_{\{Ibias\}}|R_{up}(I_{bias})-R_{down}(I_{bias})|, \qquad 6a.$$

$$\text{and } R_{loop\_n}=\Sigma_{\{Ibias\}}|R_{up}(-I_{bias})-R_{down}(-I_{bias})|, \qquad 6b.$$

$$\text{and } R_{loop}=R_{loop\_p}+R_{loop\_n} \qquad 6c.$$

$$\text{and } \sigma_{RLoop\_p}=\Sigma_{\{Ibias\}}[R_{up}(I_{bias})-R_{down}(I_{bias})]^2, \qquad 6d.$$

$$\text{and } \sigma_{RLoop\_n}=\Sigma_{\{Ibias\}}[R_{up}(-I_{bias})-R_{down}(-I_{bias})]^2, \qquad 6e.$$

$$\text{and } \sigma_{RLoop}=\sigma_{RLoop\_p}+\sigma_{RLoop\_n} \qquad 6f.$$

Figure 8:
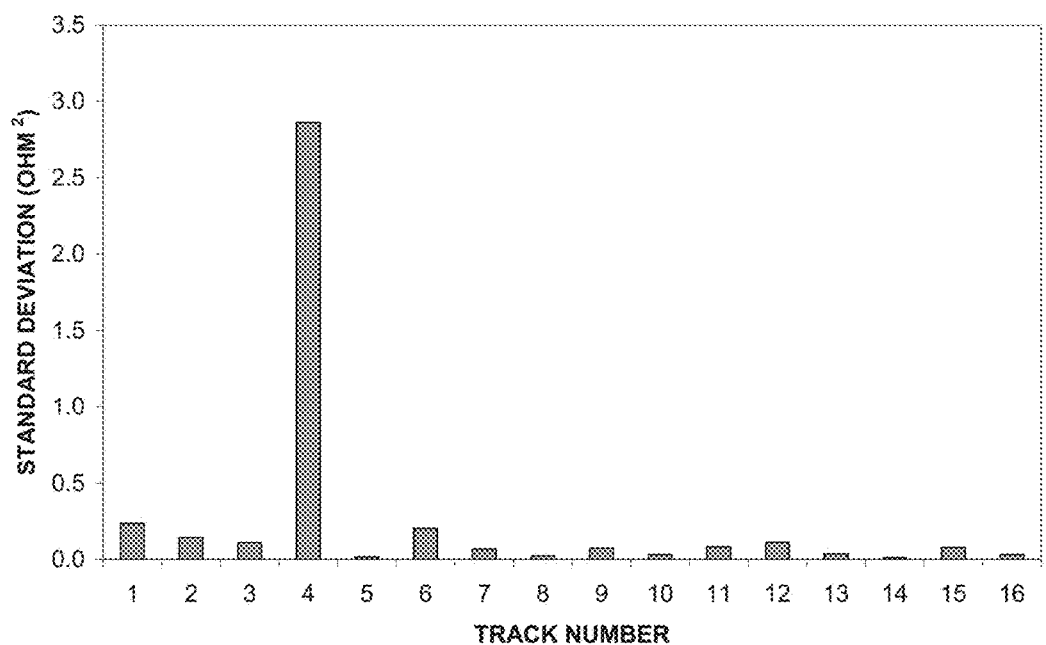
FIG. 8 is a plot of the mean-squared deviation of $Rloop = \Sigma |Rup(I) - Rdown(I)|$ versus GMR Sensor Track number.

$R_{loop\_p}$, $R_{loop\_n}$, and $R_{loop}$ are a crude integral of the areas between the up and the down loops for the positive and negative currents respectively. $\sigma_{RLoop\_p}$ and $\sigma_{RLoop\_n}$, and $\sigma_{RLoop}$ is the sum of the two. Are another measure of the deviation of the parts, and is 2* the mean-squared difference of $R_{up}$ and $R_{down}$ from the average of $R_{up}$ and $R_{down}$. $R_{loop\_p}$ and/or $R_{loop\_n}$ and/or $\sigma_{RLoop\_p}$ and/or $\sigma_{RLoop\_n}$ and/or $\sigma_{RLoop}$. should be below some predetermined value if the sensor is undamaged. The predetermined value can come from an average or a median of a large number of good parts with a range determined by the standard deviation of the values using Equation 5c. FIG. 8 is a plot of $\sigma_{RLoop}$ using all measured currents for $\{I_{bias}\}$ (1, 2, . . . , 6 and −1, −2, . . . , −6) for 16 sensors from the same module. Note that only one measurement is made for 7 and −7 mA, so these are not included. The average $\sigma_{RLoop}$ for the tracks excluding R4 is: 0.084 $\Omega^2$ with a standard deviation of 0.068 $\Omega^2$. The damaged track has a $\sigma_{RLoop}$ of 2.9 $\Omega^2$, which is 41 standard deviations over the average of the good tracks.

Other illustrative methods for detecting damage to magnetic sensors are disclosed in U.S. Patent Pub. No. 2009/

0268324A1 entitled "METHODS FOR DETECTING DAMAGE TO MAGNETORESISTIVE SENSORS," which is herein incorporated by reference. Such methods are useable in various embodiments of the present invention.

Any method, including those methods presented herein, may be used to verify that the magnetic sensor has been repaired.

Recovery of Pinned Layer Reversal

A previous section showed how one can detect that magnetic state of the sensor using $R_{pn}$ and/or $R_{pnIscaled}$. FIG. 4b shows how $R_{pnIscaled}$ changes with current magnitude. For the particular cabled sensors studied, currents through $R_s$ of 150±25 mA, or $V_{cable}$ 7.9±1.3 V can be used to cause a pinned layer reversal. Below about 125 mA (6.6 V), pinned layer reversal does not occur for these sensors, but might be appropriate for other devices. Above about 175 mA (9.3 V), the particular sensor becomes irreversibly damaged. To recover a sensor which has undergone pinned layer reversal, the CDE event is preferably chosen to be above the reversal threshold level ($V_{flip}$) but below the permanent damage level ($V_{pd}$), but with the polarity chosen to align the pinned layers in the proper direction. For these sensors, 150±25 mA is a good choice. This is achieved by setting the voltage on the cable to 7.9±1.3 V. As seen in FIG. 2, the current through $R_s$ is linear in $V_{cc}$.

GMR sensors are essentially sheet resistors with a thickness, a length (track width, W) and a height (stripe height, H). The exact equations governing the current necessary to cause pinned layer reversal versus sensor geometry are complicated but within the skill of one skilled in the art armed with the teachings herein. The general trend is for the required current to increase with increasing sensor stripe height. The stripe height can be determined by measuring the resistance ($R_{cold}$) of the sensor at a low bias current. Preferably, the current is sufficiently low as to cause minimal Joule heating of the sensor. A 1 mA bias current is a reasonable choice for measuring $R_{cold}$ for GMR sensors used to measure magnetic densities of the order of 1 GBit/in$^2$ or lower since the sensor does not heat appreciably with such a current. For GMR sensors used to measure higher data densities, a lower bias current might be chosen, but this is generally understood by those skilled in the art. Equation 7 is a simplified equation which relates the stripe height to $R_{cold}$:

$$H = R_{sheet} W / [R_{cold} - R_{lead} - R_{wire}], \qquad 7.$$

In Equation 7, $R_{wire}$ is the resistance of any wires/cables attached to the sensor, and $R_{lead}$ is any resistance internal to the wafer which attaches the external wires to the sheet portion of the sensor. $R_{sheet}$ is the sheet resistance of the GMR sensor. The current required to set the pinned layer to the proper level can be determined on a few parts which span the range of H or W allowed.

Figure 9A:
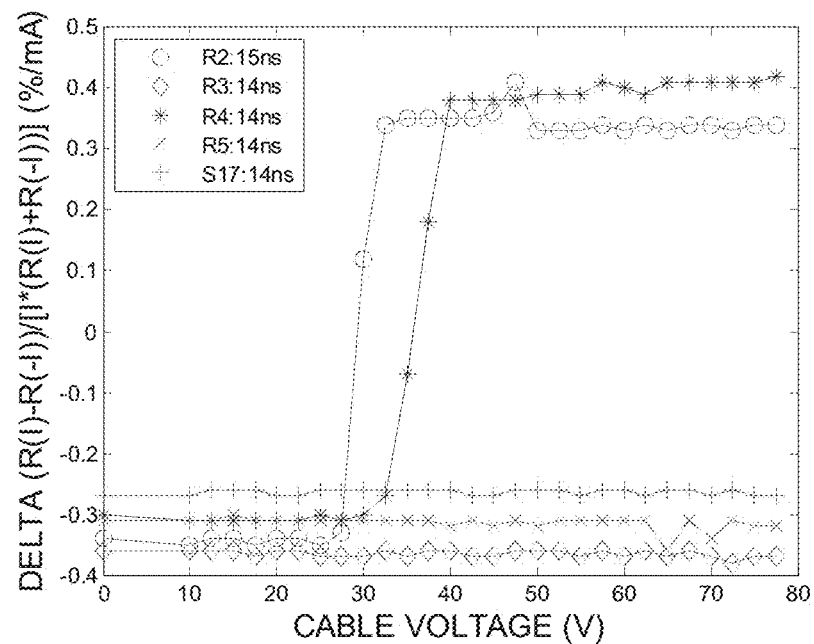
FIG. 9a is plot of change in $R_{pnIscale}$ versus voltage for a CDE event of servos and readers with diode protection.
Figure 9B:
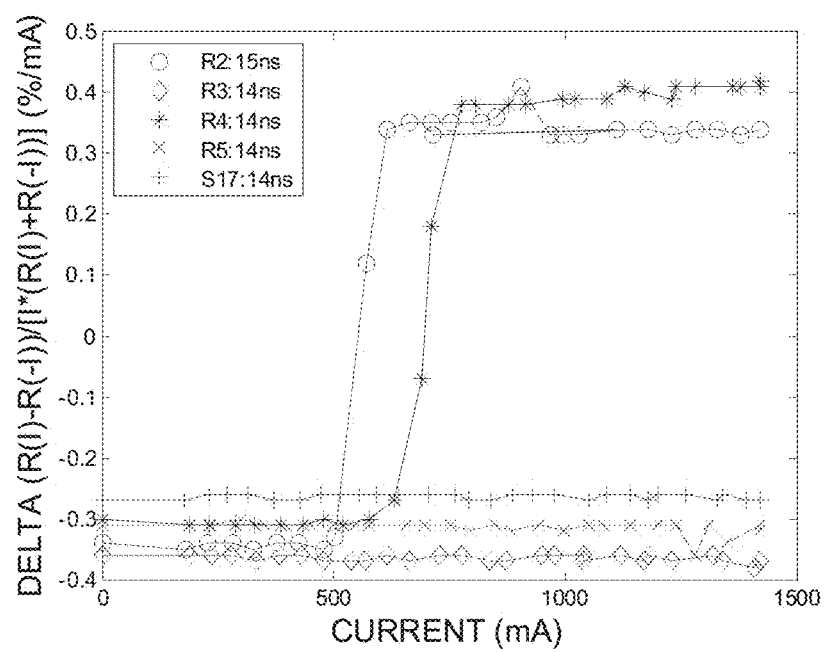
FIG. 9b is plot of change in $R_{pnIscale}$ versus current for a CDE event of servos and readers with diode protection.

The CDE process can also be used to recover parts with diodes attached to them. FIGS. 9a and 9b respectively show $R_{pnIscale}$ versus voltage and current for a CDE event of servos and readers with diode protection according to one exemplary embodiment. Positive voltages were applied to devices R2, R4 and S17 and negative voltages to devices R3 and R5. The discharge currents through the sensor are reverse (forward) directions with positive (negative) voltages on the cable. Pinned layer reversal was seen for R2 and R4 at currents of ~600 and 700 mA or voltages for $V_{cable}$ of 30 to 35 V. Thus, recovering a sensor with pinned layer reversal can be achieved in one embodiment by applying a voltage of between −40 to −80V without damaging the sensor. Recovery is then verified using the $R_{pn}$ and/or $R_{pnI}$ or and/or $R_{pnscale}$ and/or $R_{pnIscale}$ and/or $R_{loop}$ and/or $R_{loop\_p}$ and/or $R_{loop\_n}$ and/or a $\sigma_{RLoop\_n}$ and/or $\sigma_{RLoop\_p}$ and/or $\sigma_{RLoop}$ as discussed above.

Recovery of a diode protected sensor with multiple domains within the sensor is seen in FIGS. 5a-b and 6a-b. The sensor was recovered with the CDE pulse for cycle 6. The reader had diode protection, so the currents required to recover the sensor were very high (1.3 A through the 10 ohm shunt resistor in that example). As discussed earlier, recovery was verified using the $R_{pn}$ and/or $R_{pnI}$ or and/or $R_{pnscale}$ and/or $R_{pnIscale}$ and/or $R_{loop}$ and/or $R_{loop\_p}$ and/or $R_{loop\_n}$ and/or a $\sigma_{RLoop\_n}$ and/or $\sigma_{RLoop\_p}$ and/or $\sigma_{RLoop}$ as discussed above.

It will be clear that the various features of the foregoing methodologies may be combined in any way, creating a plurality of combinations from the descriptions presented above.

It will also be clear to one skilled in the art that the methodology of the present invention may suitably be embodied in a logic apparatus comprising logic to perform various steps of the methodology presented herein, and that such logic may comprise hardware components or firmware components.

It will be equally clear to one skilled in the art that the logic arrangement in various approaches may suitably be embodied in a logic apparatus comprising logic to perform various steps of the method, and that such logic may comprise components such as logic gates in, for example, a programmable logic array. Such a logic arrangement may further be embodied in enabling means or components for temporarily or permanently establishing logical structures in such an array using, for example, a virtual hardware descriptor language, which may be stored using fixed or transmittable carrier media.

It will be appreciated that the methodology described above may also suitably be carried out fully or partially in software running on one or more processors (not shown), and that the software may be provided as a computer program element carried on any suitable data carrier (also not shown) such as a magnetic or optical computer disc. The channels for the transmission of data likewise may include storage media of all descriptions as well as signal carrying media, such as wired or wireless signal media.

Embodiments of the present invention may suitably be embodied as a computer program product for use with a computer system. Such an implementation may comprise a series of computer readable instructions either fixed on a tangible medium, such as a computer readable medium, for example, diskette, CD-ROM, ROM, or hard disk, or transmittable to a computer system, via a modem or other interface device, over either a tangible medium, including but not limited to optical or analogue communications lines, or intangibly using wireless techniques, including but not limited to microwave, infrared or other transmission techniques. The series of computer readable instructions embodies all or part of the functionality previously described herein.

Those skilled in the art will appreciate that such computer readable instructions can be written in a number of programming languages for use with many computer architectures or operating systems. Further, such instructions may be stored using any memory technology, present or future, including but not limited to, semiconductor, magnetic, or optical, or transmitted using any communications technology, present or future, including but not limited to optical, infrared, or microwave. It is contemplated that such a computer program product may be distributed as a removable medium with accompanying printed or electronic documentation, for example, shrink-wrapped software, preloaded with a computer system, for example, on a system ROM or fixed disk, or distributed from a server or electronic bulletin board over a network, for example, the Internet or World Wide Web.

Communications components such as input/output or I/O devices (including but not limited to keyboards, displays, pointing devices, etc.) can be coupled to the system either directly or through intervening I/O controllers.

Communications components such as buses, interfaces, network adapters, etc. may also be coupled to the system to enable the data processing system, e.g., host, to become coupled to other data processing systems or remote printers or storage devices through intervening private or public networks. Modems, cable modem and Ethernet cards are just a few of the currently available types of network adapters.

It will be further appreciated that embodiments of the present invention may be provided in the form of a service deployed on behalf of a customer to offer service on demand.

Illustrative Environment

The foregoing teachings apply to any type of magnetic sensor, including those for tape head, disk drive heads, and other types of sensors.

Figure 10:
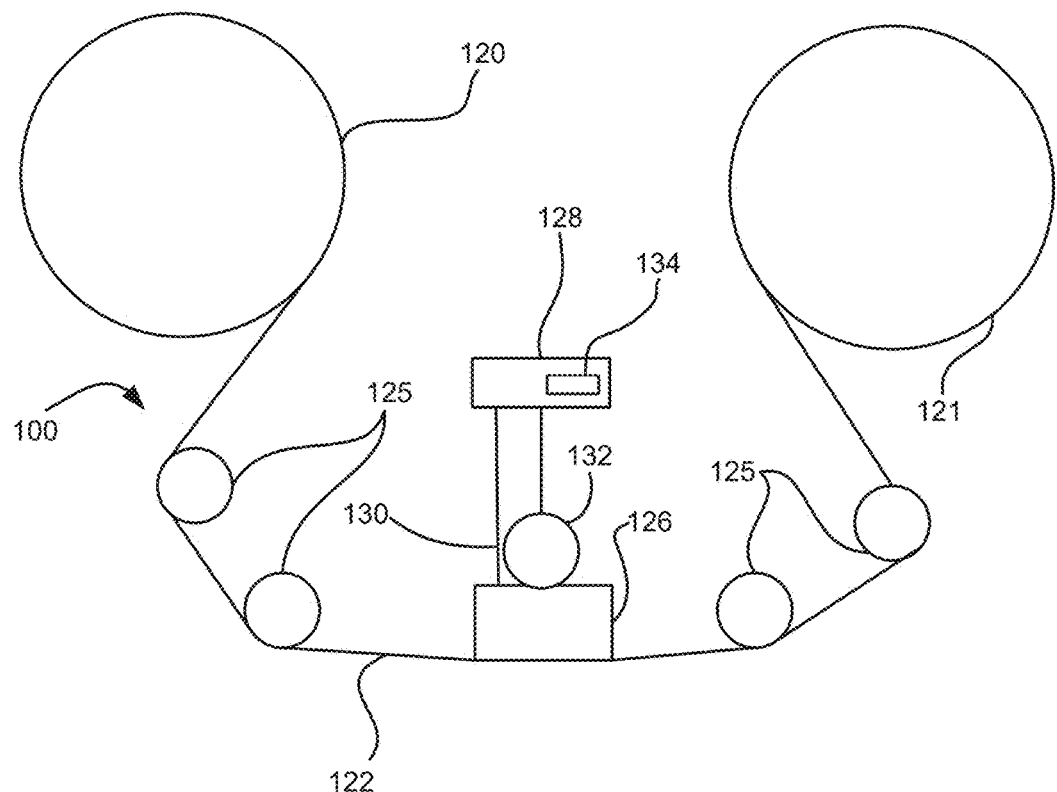
FIG. 10 is a schematic diagram of a simplified tape drive system according to one embodiment.

FIG. 10 illustrates a simplified tape drive 100 of a tape-based data storage system, which may be employed in the context of the present invention. While one specific implementation of a tape drive is shown in FIG. 10, it should be noted that the embodiments described herein may be implemented in the context of any type of tape drive system.

As shown, a tape supply cartridge 120 and a take-up reel 121 are provided to support a tape 122. One or more of the reels may form part of a removable cassette and are not necessarily part of the system 100. The tape drive, such as that illustrated in FIG. 10, may further include drive motor(s) to drive the tape supply cartridge 120 and the take-up reel 121 to move the tape 122 over a tape head 126 of any type.

Guides 125 guide the tape 122 across the tape head 126. Such tape head 126 is in turn coupled to a controller assembly 128 via a cable 130. The controller 128 typically controls head functions such as servo following, writing, reading, etc. The cable 130 may include read/write circuits to transmit data to the head 126 to be recorded on the tape 122 and to receive data read by the head 126 from the tape 122. An actuator 132 controls position of the head 126 relative to the tape 122.

An interface 134 may also be provided for communication between the tape drive and a host (integral or external) to send and receive the data and for controlling the operation of the tape drive and communicating the status of the tape drive to the host, all as will be understood by those of skill in the art.

Figure 11:
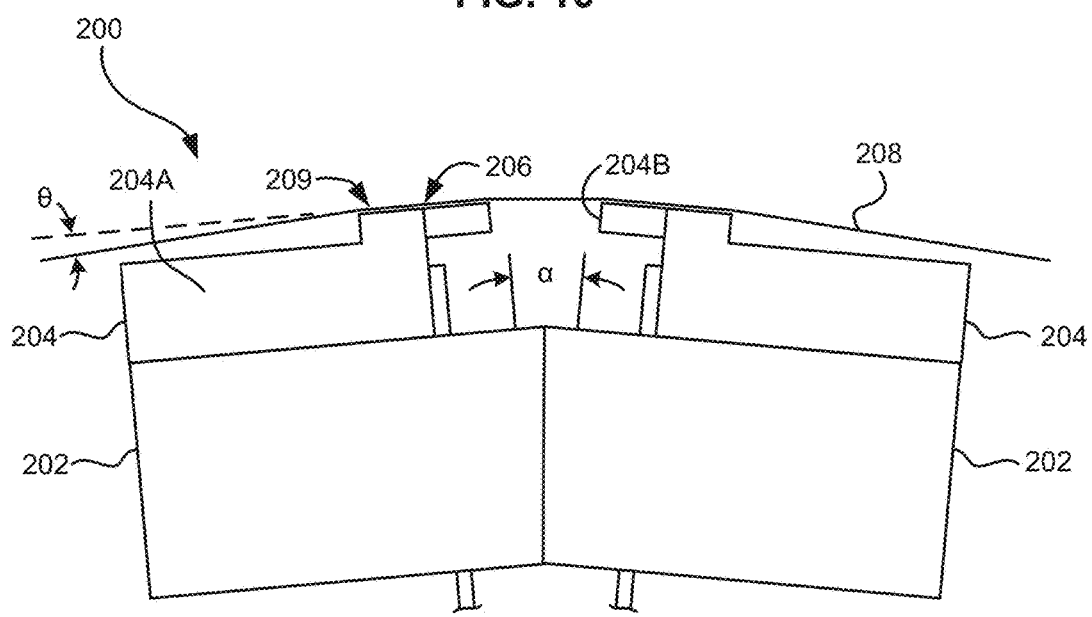
FIG. 11 illustrates a side view of a flat-lapped, bi-directional, two-module magnetic tape head according to one embodiment.

By way of example, FIG. 11 illustrates a side view of a flat-lapped, bi-directional, two-module magnetic tape head 200 which may be implemented in the context of the present invention. As shown, the head includes a pair of bases 202, each equipped with a module 204, and fixed at a small angle α with respect to each other. The bases are typically "U-beams" that are adhesively coupled together. Each module 204 includes a substrate 204A and a closure 204B with a thin film portion, commonly referred to as a "gap" in which the readers and/or writers 206 are formed. In use, a tape 208 is moved over the modules 204 along a media (tape) bearing surface 209 in the manner shown for reading and writing data on the tape 208 using the readers and writers. The wrap angle θ of the tape 208 at edges going onto and exiting the flat media support surfaces 209 are usually between ⅛ degree and 4½ degrees.

The substrates 204A are typically constructed of a wear resistant material, such as a ceramic. The closures 204B made of the same or similar ceramic as the substrates 204A.

The readers and writers may be arranged in a piggyback configuration. The readers and writers may also be arranged in an interleaved configuration. Alternatively, each array of channels may be readers or writers only. Any of these arrays may contain one or more servo readers.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system for testing a magnetic sensor, comprising:
   a discharge circuit to cause a discharge event on a magnetic sensor;
   a bias generation circuit to apply at least one first bias current to the sensor and at least one second bias current to the sensor, the second bias current being different than the first bias current;
   a resistance determination circuit to determine a resistance of the magnetic sensor at each of the applied bias currents; and
   a damage determination circuit to determine whether the magnetic sensor is at least one of damaged or was fixed by a discharge event based on the resistances.

2. A system as recited in claim 1, wherein the discharge circuit includes a shorting resistor connected between one lead of the magnetic sensor and ground whereby a connection between the one lead and the shorting resistor coupled to ground is made or broken using a relay.

3. A system as recited in claim 1, wherein a pulse width of the discharge event has a duration of less than about 45 nanoseconds (ns).

4. A system as recited in claim 1, wherein a cable is coupled between the logic for causing the discharge event and the magnetic sensor, wherein the cable functions as extensions of a leads of the magnetic sensor.

5. A system as recited in claim 1, wherein the at least one second bias current is of an opposite polarity as the first bias current.

6. A system as recited in claim 1, wherein the damage determination circuit uses at least one of the following equations:

$$R_{pn}(I_{bias}) = [R(+I_{bias}) - R(-I_{bias})];$$

$$R_{pnscaled}(I_{bias}) = [R(+I_{bias}) - R(-I_{bias})]/[[R(+I_{bias}) - R(-I_{bias})]];$$

$$R_{pnI}(I_{bias}) = [R(+I_{bias}) - R(-I_{bias})]/I_{bias};$$

$$R_{pnIscaled}(I_{bias}) = [R(+I_{bias}) - R(-I_{bias})]/[I_{bias} * [R(-I_{bias}) - R(-I_{bias})]];$$

$$<f> = \Sigma_{\{Ibias\}} f(I_{bias}), \text{where } f(I_{bias}) \text{ is selected from a group consisting of}: R_{pn}(I_{bias}), R_{pnI}(I_{bias}), R_{pnscale}(I_{bias}) \text{ and } R_{pnIscale}(I_{bias});$$

$$R_{loop\_p} = \Sigma_{\{Ibias\}} |R_{up}(I_{bias}) - R_{down}(I_{bias})|;$$

$$R_{loop\_n} = \Sigma_{\{Ibias\}} |R_{up}(-I_{bias}) - R_{down}(-I_{bias})|;$$

$$R_{loop} = R_{loop\_p} + R_{loop\_n};$$

$$\sigma_{RLoop\_p} = \Sigma_{\{Ibias\}} [R_{up}(I_{bias}) - R_{down}(I_{bias})]^2;$$

$$\sigma_{RLoop\_n} = \Sigma_{\{Ibias\}} [R_{up}(-I_{bias}) - R_{down}(-I_{bias})]^2, \text{ and}$$

$$\sigma_{RLoop} = \sigma_{RLoop\_p} + \sigma_{RLoop\_n};$$

and where ($I_{bias}$) is one or more predetermined bias currents.

7. A computer program product for determining whether a magnetic sensor is damaged, the computer program product comprising a computer readable storage medium having program instructions embodied therewith, the program instructions executable by a processing circuit to cause the processing circuit to:

measure, by the processing circuit, resistances of a magnetic sensor at multiple bias currents;

determine, by the processing circuit, that the magnetic sensor is damaged based on the measured resistances;

select, by the processing circuit, a bias voltage sufficient to cause a discharge event that repairs the damaged magnetic sensor to a proper magnetic state thereof;

apply, by the processing circuit, the bias voltage to the magnetic sensor; and couple, by the processing circuit, the lead of the magnetic sensor to ground after applying the bias voltage for causing the discharge event, wherein the discharge event fixes the damaged magnetic sensor.

8. A computer program product as recited in claim 7, comprising program instructions executable by the processing circuit to cause the processing circuit to determine a resistance (Rcold) of the sensor using a current sufficiently low as to cause minimal Joule heating of the sensor, and determine a voltage level (Vflip) sufficient to cause pinned layer reversal and a voltage level (Vpd) sufficient to cause permanent damage to the magnetic sensor, wherein the selected bias voltage is between the voltage level (Vflip) sufficient to cause pinned layer reversal and the voltage level (Vpd) sufficient to cause permanent damage to the magnetic sensor.

9. A computer program product as recited in claim 7, wherein a pulse width of the discharge event has a duration of less than about 45 nanoseconds (ns).

10. A computer program product as recited in claim 7, wherein the program instructions for determining whether the magnetic sensor is damaged uses at least one of the following equations:

$$R_{pn}(I_{bias}) = [R(+I_{bias}) - R(-I_{bias})];$$

$$R_{pnscaled}(I_{bias}) = [R(+I_{bias}) - R(-I_{bias})]/[[R(+I_{bias}) - R(-I_{bias})]];$$

$$R_{pnI}(I_{bias}) = [R(+I_{bias}) - R(-I_{bias})]/I_{bias};$$

$$R_{pnIscaled}(I_{bias}) = [R(+I_{bias}) - R(-I_{bias})]/[I_{bias} * [R(+I_{bias}) - R(-I_{bias})]];$$

$$<f> = \Sigma_{\{Ibias\}} f(I_{bias}), \text{ where } f(I_{bias}) \text{ is selected from a group consisting of: } R_{pn}(I_{bias}), R_{pnI}(I_{bias}), R_{pnscale}(I_{bias}) \text{ and } R_{pnIscale}(I_{bias});$$

$$R_{loop\_p} = \Sigma_{\{Ibias\}} |R_{up}(I_{bias}) - R_{down}(I_{bias})|;$$

$$R_{loop\_n} = \Sigma_{\{Ibias\}} |R_{up}(-I_{bias}) - R_{down}(-I_{bias})|;$$

$$R_{loop} = R_{loop\_p} + R_{loop\_n};$$

$$\sigma_{RLoop\_p} = \Sigma_{\{Ibias\}} [R_{up}(I_{bias}) - R_{down}(I_{bias})]^2;$$

$$\sigma_{RLoop}^+ n = \Sigma_{\{Ibias\}} [R_{up}(-I_{bias}) - R_{down}(-I_{bias})]^2, \text{ and}$$

$$\sigma_{RLoop} = \sigma_{RLoop\_p} + \sigma_{RLoop\_n};$$

and where ($I_{bias}$) is one or more predetermined bias currents.

* * * * *